(12) United States Patent
Gao

(10) Patent No.: US 9,857,394 B2
(45) Date of Patent: Jan. 2, 2018

(54) MULTIPLE CHANNEL CAPACITIVE VOLTAGE DIVIDER SCANNING METHOD AND APPARATUS

(71) Applicant: Microchip Technology Incorporated, Chandler, AZ (US)

(72) Inventor: Xiang Gao, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 203 days.

(21) Appl. No.: 14/503,702

(22) Filed: Oct. 1, 2014

(65) Prior Publication Data

US 2015/0097583 A1   Apr. 9, 2015

Related U.S. Application Data

(60) Provisional application No. 61/886,993, filed on Oct. 4, 2013.

(51) Int. Cl.
*G01R 27/26* (2006.01)
*G01R 15/00* (2006.01)
(Continued)

(52) U.S. Cl.
CPC ............. *G01R 15/002* (2013.01); *G01R 1/30* (2013.01); *G01R 27/2605* (2013.01); *H03M 1/1245* (2013.01)

(58) Field of Classification Search
CPC .......... G01R 1/30; G01R 27/00; G01R 27/26; G01R 27/2605; G01R 15/002; G01D 5/12;
(Continued)

(56) References Cited

U.S. PATENT DOCUMENTS 6,452,514 B1 *  9/2002 Philipp ................ G01D 5/2405
                                                    178/18.06
9,312,831 B2 *  4/2016 Nestler .................. H03H 15/02
(Continued)

FOREIGN PATENT DOCUMENTS

CN        101213461 A       7/2008

OTHER PUBLICATIONS

International Search Report and Written Opinion, Application No. PCT/US2014/058788, 12 pages, dated Feb. 27, 2015.
(Continued)

*Primary Examiner* — Thang Le
(74) *Attorney, Agent, or Firm* — Slayden Grubert Beard PLLC

(57) ABSTRACT

Relative capacitance of a plurality of capacitive sensors may be monitored by using only one ADC conversion. A plurality of capacitive sensors individually charges a sample and hold capacitor. After all of the plurality of capacitive sensors have charged the sample and hold capacitor, a digital conversion of the resulting analog on the sample and hold capacitor is made and stored in a memory. This stored digital collective voltage is compared to a previously stored one and if different then a proximity/touch event may have occurred. Therefore, an entire panel of capacitive sensors may be quickly monitored for a change in the "group" capacitance thereof, or portions of the capacitive sensors may be monitored for a change in the "subgroup" capacitance thereof. By knowing which subgroup of capacitive sensors has changed its collective capacitive value, a more focused and selective capacitive sensor measurement can be made that uses less power.

13 Claims, 18 Drawing Sheets

(51) Int. Cl.
*G01R 1/30* (2006.01)
*H03M 1/12* (2006.01)

(58) Field of Classification Search
CPC .. G01D 5/24; G01D 5/26; G06F 3/044; G06F 3/0416; G06F 3/045; H03K 17/962; H03K 17/955
USPC ....... 324/679, 678, 658, 662, 607, 609, 663, 324/684, 686; 702/64, 65, 57, 117; 345/173, 174
See application file for complete search history.

(56) References Cited

U.S. PATENT DOCUMENTS

| | | | | |
|---|---|---|---|---|
| 9,372,582 | B2* | 6/2016 | Brunet | G06F 3/044 |
| 2007/0075710 | A1* | 4/2007 | Hargreaves | G01R 27/2605 |
| | | | | 324/658 |
| 2008/0246723 | A1 | 10/2008 | Baumbach | 345/156 |
| 2010/0148806 | A1* | 6/2010 | Hargreaves | G01R 27/2605 |
| | | | | 324/679 |
| 2010/0181180 | A1* | 7/2010 | Peter | H03K 17/955 |
| | | | | 200/5 R |
| 2012/0054379 | A1* | 3/2012 | Leung | G06F 1/3206 |
| | | | | 710/23 |
| 2014/0002406 | A1* | 1/2014 | Cormier, Jr. | G06F 3/044 |
| | | | | 345/174 |
| 2014/0111225 | A1* | 4/2014 | Hristov | G06F 3/0416 |
| | | | | 324/672 |
| 2014/0368223 | A1* | 12/2014 | Huang | G06F 3/044 |
| | | | | 324/678 |

OTHER PUBLICATIONS

Taiwan Office Action, Application No. 103134656, 6 pages, dated Nov. 3, 2017.

* cited by examiner

US 9,857,394 B2

MULTIPLE CHANNEL CAPACITIVE VOLTAGE DIVIDER SCANNING METHOD AND APPARATUS

RELATED PATENT APPLICATION

This application claims priority to commonly owned U.S. Provisional Patent Application Ser. No. 61/886,993; filed Oct. 4, 2013; is hereby incorporated by reference herein for all purposes.

TECHNICAL FIELD

The present disclosure relates to a method and apparatus for scanning a plurality of capacitive sensors connected to analog-to-digital converter (ADC) input channels using the capacitive voltage division method for determining the change in capacitance thereof.

BACKGROUND

For low power systems, microcontrollers used in these low power systems need to be in a sleep mode when a user is not actively using the system, however, the capacitive sensing only operates in an active mode, so in order to achieve low power consumption for a system involving capacitive measurement, the system must wake up from its sleep mode for a certain time interval, perform a burst scan of all capacitive sensors, do an evaluation of whether a capacitance change from a previous scan has occurred, and then return to its sleep mode if no capacitance change is detected. The system will continue this sleep/wakeup alternation until a touch/proximity on any capacitive sensors is detected. The average power consumption of the system can be reduced by minimizing the wakeup time that is spent on scanning of all the capacitive sensors.

SUMMARY

Therefore a need exists for microcontrollers to have the capability of scanning multiple capacitive sensors while spending as little time as possible in order to save power consumption.

According to an embodiment, a method for determining change in capacitance of at least one capacitive sensor of a plurality of capacitive sensors may comprise the steps of: charging a plurality of capacitive sensors to a first voltage; charging a sample and hold capacitor to a second voltage; individually coupling each one of the plurality of capacitive sensors to the sample and hold capacitor, wherein electron charge from each of the individually coupled ones of the plurality of capacitive sensors may be transferred to the sample and hold capacitor; measuring a resulting voltage on the sample and hold capacitor after all of the plurality of capacitive sensors have been individually coupled to the sample and hold capacitor; and comparing the measured resulting voltage to a previously measured resulting voltage, wherein if the measured resulting voltage may be different than the previously measured resulting voltage then at least one capacitive sensor of the plurality of capacitive sensors may have changed capacitance value.

According to a further embodiment of the method, may comprise the steps of: (a) charging a first one of the plurality of capacitive sensors to the first voltage; (b) charging the sample and hold capacitor to the second voltage; (c) coupling the first one of the plurality of capacitive sensors to the sample and hold capacitor, wherein electron charge from the first one of the plurality of capacitive sensors may be transferred to the sample and hold capacitor; (d) measuring a resulting voltage on the sample and hold capacitor; and (e) comparing the measured resulting voltage to a previously measured resulting voltage of the first one of the plurality of capacitive sensors, wherein if the measured resulting voltage may be different than the previously measured resulting voltage then the first one of the plurality of capacitive sensors may have changed capacitance value, if not then repeat steps (a) through (e) with another one of the plurality of capacitive sensors.

According to a further embodiment of the method, may comprise the steps of: charging a portion of the plurality of capacitive sensors to the first voltage; charging the sample and hold capacitor to the second voltage; individually coupling each one of the portion of the plurality of capacitive sensors to the sample and hold capacitor, wherein electron charge from each of the individually coupled ones of the portion of the plurality of capacitive sensors may be transferred to the sample and hold capacitor; measuring a resulting voltage on the sample and hold capacitor after all of the portion of the plurality of capacitive sensors have been individually coupled to the sample and hold capacitor; and comparing the measured resulting voltage to a previously measured resulting voltage of the portion of the plurality of capacitive sensors, wherein if the measured resulting voltage may be different than the previously measured resulting voltage then at least one capacitive sensor of the portion of the plurality of capacitive sensors may have changed capacitance value.

According to a further embodiment of the method, the first voltage may be more positive than the second voltage. According to a further embodiment of the method, the second voltage may be more positive than the first voltage. According to a further embodiment of the method, the step of measuring the resulting voltage may comprise the step of converting the resulting voltage on the sample and hold capacitor to a digital value with an analog-to-digital converter (ADC). According to a further embodiment of the method, the step of comparing the measured resulting voltage to a previously measured resulting voltage may comprise the steps of comparing the digital value go a previous digital value with a digital processor. According to a further embodiment of the method, may comprise the step of waking up the digital processor from a low power sleep mode when the measured resulting voltage may be different from the previously measured resulting voltage.

According to another embodiment, a method for determining change in capacitance of at least one capacitive sensor of a plurality of capacitive sensors may comprise the steps of: charging a plurality of capacitive sensors to a first voltage; charging a sample and hold capacitor to a second voltage; coupling the plurality of capacitive sensors to the sample and hold capacitor, wherein electron charge from the plurality of capacitive sensors may be transferred to the sample and hold capacitor; measuring a resulting voltage on the sample and hold capacitor; and comparing the resulting voltage to a previously measured resulting voltage, wherein if the resulting voltage may be different than the previously measured resulting voltage then at least one capacitive sensor of the plurality of capacitive sensors may have changed capacitance value.

According to a further embodiment of the method, may comprise the steps of: charging a portion of the plurality of capacitive sensors to the first voltage; charging the sample and hold capacitor to the second voltage; coupling the portion of the plurality of capacitive sensors to the sample and hold capacitor, wherein electron charge from the portion of the plurality of capacitive sensors may be transferred to the sample and hold capacitor; measuring a resulting voltage on the sample and hold capacitor; and comparing the measured resulting voltage to a previously measured resulting voltage of the portion of the plurality of capacitive sensors, wherein if the measured resulting voltage may be different than the previously measured resulting voltage then at least one capacitive sensor of the portion of the plurality of capacitive sensors may have changed capacitance value.

According to a further embodiment of the method, may comprise if the measured resulting voltage may be not substantially different than the previously measured resulting voltage then may perform the steps of: charging another portion of the plurality of capacitive sensors to the first voltage; charging the sample and hold capacitor to the second voltage; coupling the another portion of the plurality of capacitive sensors to the sample and hold capacitor, wherein electron charge from the another portion of the plurality of capacitive sensors may be transferred to the sample and hold capacitor; measuring another resulting voltage on the sample and hold capacitor; and comparing the another resulting voltage to a previously measured another resulting voltage of the another portion of the plurality of capacitive sensors, wherein if the resulting another voltage may be different than the previously measured another resulting voltage then at least one capacitive sensor of the another portion of the plurality of capacitive sensors may have changed capacitance value.

According to a further embodiment of the method, may comprise the steps of: (a) charging a first one of the portion of the plurality of capacitive sensors to the first voltage; (b) charging the sample and hold capacitor to the second voltage; (c) coupling the first one of the portion of the plurality of capacitive sensors to the sample and hold capacitor, wherein electron charge from the first one of the portion of the plurality of capacitive sensors may be transferred to the sample and hold capacitor; (d) measuring a resulting voltage on the sample and hold capacitor; and (e) comparing the measured resulting voltage to a previously measured resulting voltage of the first one of the portion of the plurality of capacitive sensors, wherein if the measured resulting voltage may be different than the previously measured resulting voltage then the first one of the portion of the plurality of capacitive sensors may have changed capacitance value, if not repeat steps (a) through (e) with another one of the portion of the plurality of capacitive sensors.

According to a further embodiment of the method, the first voltage may be more positive than the second voltage. According to a further embodiment of the method, the second voltage may be more positive than the first voltage. According to a further embodiment of the method, the step of measuring the resulting voltage comprises the step of converting the resulting voltage on the sample and hold capacitor to a digital value with an analog-to-digital converter (ADC). According to a further embodiment of the method, the step of comparing the measured resulting voltage to a previously measured resulting voltage may comprise the steps of comparing the digital value to a previous digital value with a digital processor. According to a further embodiment of the method, may comprise the step of waking up the digital processor from a low power sleep mode when the measured resulting voltage may be different from the previously measured resulting voltage.

According to yet another embodiment, an apparatus, operating in accordance with the methods disclosed and claimed herein, for determining change in capacitance of at least one capacitive sensor of a plurality of capacitive sensors, may comprise: a plurality of capacitive sensors; a sample and hold capacitor; a multiplexer having a plurality of inputs and an output; a plurality of capacitive sensor switches coupled to the plurality of capacitive sensors, and adapted to selectively couple each of the plurality of capacitive sensors to the first voltage, the second voltage or a respective input of the multiplexer; a sample and hold capacitor; a sample and hold switch coupled between the output of the multiplexer and the sampler and hold capacitor; an analog-to-digital converter (ADC) having an analog input coupled to the sample and hold capacitor; and a digital processor coupled to an output of the ADC and adapted to control the plurality of capacitive sensor switches, multiplexer, and sample and hold switch.

According to a further embodiment, the plurality of capacitive sensor switches, the multiplexer, the sample and hold capacitor, the ADC and the digital processor may be provided in a microcontroller. According to a further embodiment, a capacitive sensor scan controller may be provided to perform the methods disclosed and claimed herein while the digital processor may be in a low power sleep mode. According to a further embodiment, the capacitive sensor scan controller may wake up the digital processor from the low power sleep mode when the at least one capacitive sensor of the plurality of capacitive sensors may have changed capacitance value.

According to still another embodiment, an apparatus, operating in accordance with methods disclosed and claimed herein, for determining change in capacitance of at least one capacitive sensor of a plurality of capacitive sensors may comprise: a plurality of capacitive sensors; a sample and hold capacitor; a multiplexer having a plurality of inputs and an output; a plurality of capacitive sensor switches coupled to the plurality of capacitive sensors, and adapted to couple the plurality of capacitive sensors to the first voltage, the second voltage or an input of the multiplexer; a sample and hold capacitor; a sample and hold switch coupled between the output of the multiplexer and the sampler and hold capacitor; an analog-to-digital converter (ADC) having an analog input coupled to the sample and hold capacitor; and a digital processor coupled to an output of the ADC and adapted to control the plurality of capacitive sensor switches, multiplexer, and sample and hold switch.

According to a further embodiment, the plurality of capacitive sensor switches, the multiplexer, the sample and hold capacitor, the ADC and the digital processor may be provided in a microcontroller. According to a further embodiment, a capacitive sensor scan controller may be provided for performing the methods disclosed and claimed herein while the digital processor may be in a low power sleep mode. According to a further embodiment, the capacitive sensor scan controller may wake up the digital processor from the low power sleep mode when the at least one capacitive sensor of the plurality of capacitive sensors may have changed capacitance value.

BRIEF DESCRIPTION OF THE DRAWINGS

A more complete understanding of the present disclosure may be acquired by referring to the following description taken in conjunction with the accompanying drawings wherein.

Figure 1A:
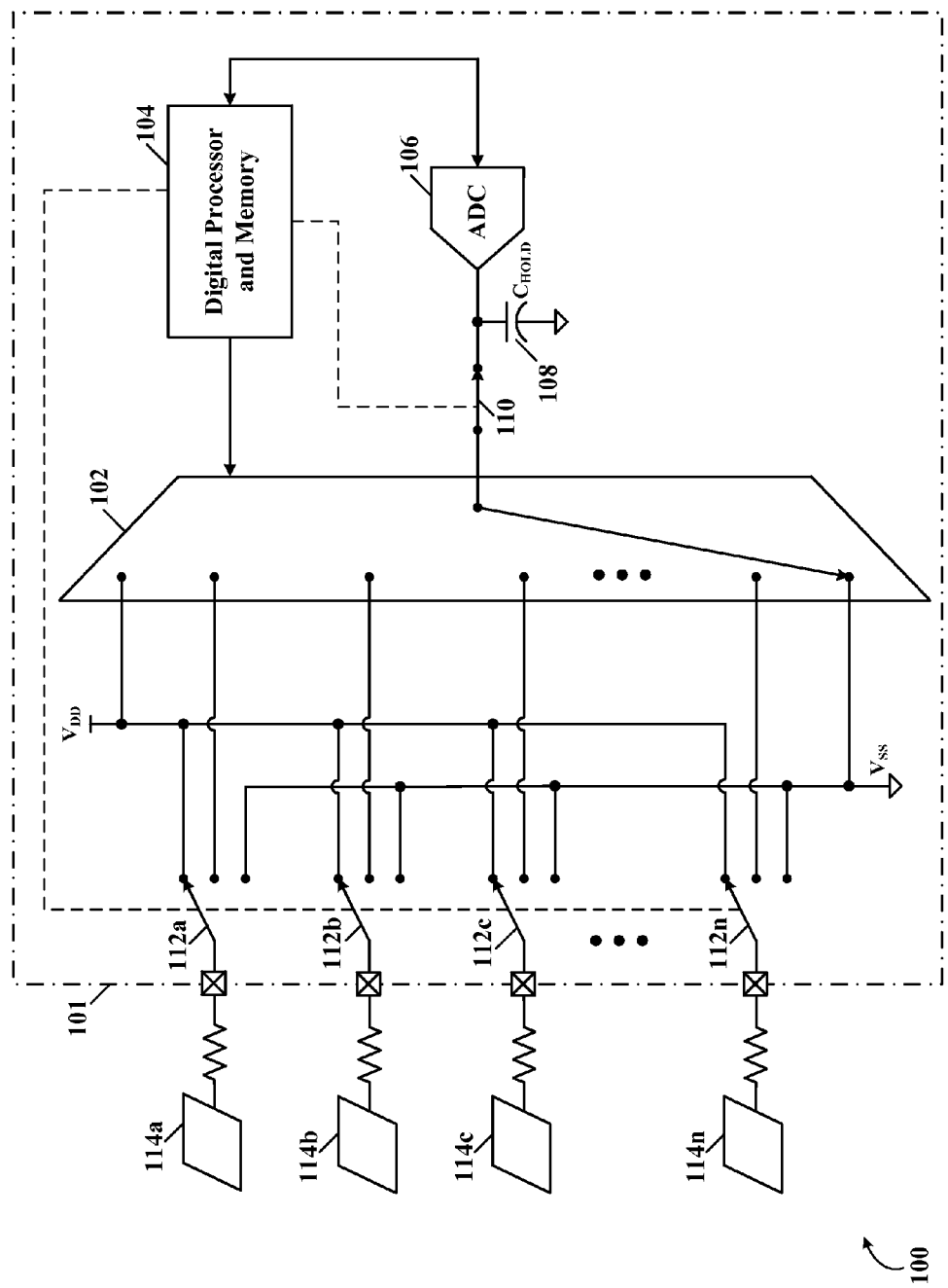
FIGS. 1(a)-1(f) illustrate schematic diagrams of sequential switching configurations for measuring a plurality of capacitive sensors, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Touching of a capacitive sensor or approaching a capacitive proximity sensor by an object, e.g., a piece of metal, a finger, a hand, a foot, a leg, etc., changes certain parameters thereof, in particular the capacitance value of a capacitor that is built into the touch sensor used, for example, in human-machine interface devices, e.g., keypad or keyboard. Microcontrollers may utilize algorithms or built-in peripherals for the detection and evaluation of such capacitive touch sensors. One such application utilizes capacitive voltage division (CVD) to evaluate whether a capacitive touch element has been touched or not. The CVD conversion process requires that the sensor capacitor be charged and ADC sample-and-hold capacitor be discharged by different voltages, or vice versa, before being connected together for conversion of the resulting voltage. The touch sensor capacitance can be charged/discharged by a driver connected to an external node (integrated circuit package pin), but the ADC sample-and-hold capacitor may be connected to an external pin or internal ADC channel, e.g., DAC output, fixed voltage reference output to be discharged/charged.

By first determining the capacitance value of an untouched capacitive sensor plate and then determining a subsequent capacitance value of a touched capacitive sensor plate, a touch to that capacitive sensor plate may be determined based upon the change in capacitance thereof. In CVD two capacitors are charged/discharged to opposite voltage values. Then the two oppositely charged capacitors are coupled together and a resulting voltage is measured after the two capacitors have been connected together a sufficient time for a quiescent (steady) voltage to be reached. A more detailed explanation of CVD is presented in commonly owned United States Patent Application Publication No. US 2010/0181180, entitled "Capacitive Touch Sensing Using an Internal Capacitor of an Analog-to-digital Converter (ADC) and a Voltage Reference," by Dieter Peter, and is hereby incorporated by reference herein for all purposes.

According to various embodiments, the relative capacitance of a plurality of capacitive sensors may be monitored using only one ADC conversion. The system may generally include a plurality of capacitive sensors into a single measurement. According to some embodiments, all available capacitive sensors may be included in a measurement. According to other embodiments, only a selected sub-group of n capacitive sensors may be included, wherein n is greater than one (1). Thus an entire panel of capacitive sensors may be quickly monitored for a change in the "group" capacitance thereof, or portions of the capacitive sensors may be monitored for a change in the "subgroup" capacitance thereof. By knowing which subgroup of capacitive sensors has changed its collective capacitive value, a more focused and selective capacitive sensor measurement can be made. Also the system average power consumption is reduced because of less time spent doing capacitive sensor scans.

Referring now to the drawings, the details of specific example embodiments are schematically illustrated. Like elements in the drawings will be represented by like numbers, and similar elements will be represented by like numbers with a different lower case letter suffix.

Referring to FIGS. 1(a)-1(f), depicted are schematic diagrams of sequential switching configurations for measuring a plurality of capacitive sensors, according to a specific example embodiment of this disclosure. The circuit shown in FIGS. 1(a)-(f) may "collect" the charges on a plurality of capacitive sensors 114 in a sample and hold capacitor 108 before doing an analog-to-digital conversion of these collect charges. A capacitive sensor touch/proximity system, generally represented by the numeral 100, may comprise a plurality of capacitive sensors 114, capacitive sensor channel switches 112, a multiplexer 102, a sample and hold switch 110, a sample and hold capacitor 108, an analog-to-digital converter (ADC) 106, and a digital processor and memory 104. The aforementioned capacitive sensor channel switches 112, multiplexer 102, sample and hold switch 110, sample and hold capacitor 108, ADC 106, and digital processor and memory 104 may be provided in a microcontroller integrated circuit 101.

The capacitive sensor channel switches 112 may connect respective ones of the plurality of capacitive sensors 114 to either a first voltage, e.g., $V_{DD}$, a second voltage, e.g., $V_{SS}$, or respective inputs of the multiplexer 102. Connecting a capacitive sensor 114 to a positive voltage puts a positive charge thereon, and connecting the capacitive sensor 114 to a common or ground removes substantially any charge thereon. The multiplexer 102 is adapted to couple the sample and hold switch 110 to any one of the capacitive sensor channel switches 112, the first voltage, e.g., $V_{DD}$, or the second voltage, e.g., $V_{SS}$. The sample and hold switch 110 couplers the output of the multiplexer 102 to the sample and hold capacitor 108 and also may be used to isolate the sample and hold capacitor 108 during an analog-to-digital conversion by the ADC 106. The resulting analog-to-digital conversion from the ADC 106 may be read by the digital processor 104 for further processing in determining whether at least one of the plurality of capacitive sensors 114 has changed its capacitance value.

Figure 1B:
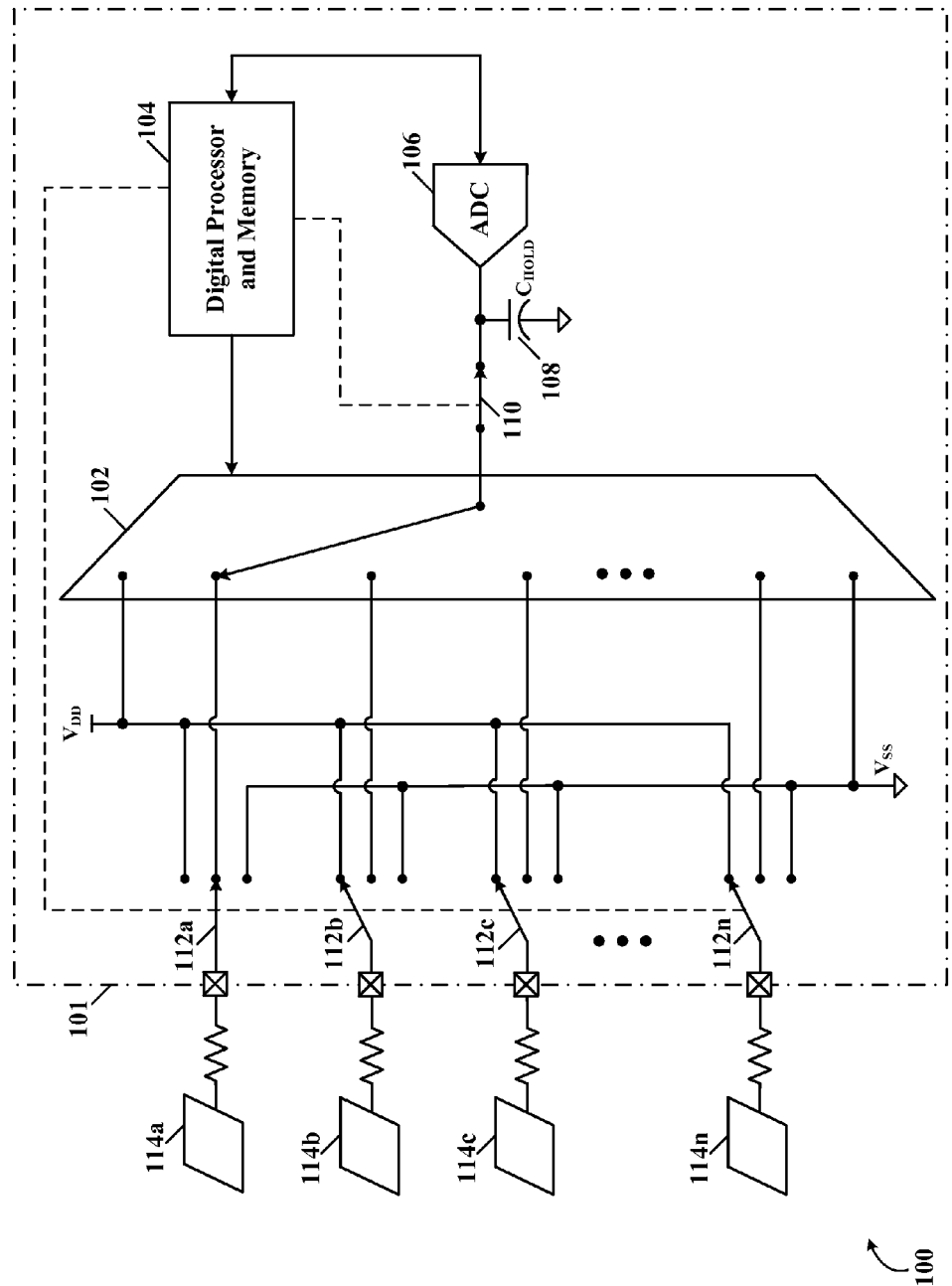
Figure 2:
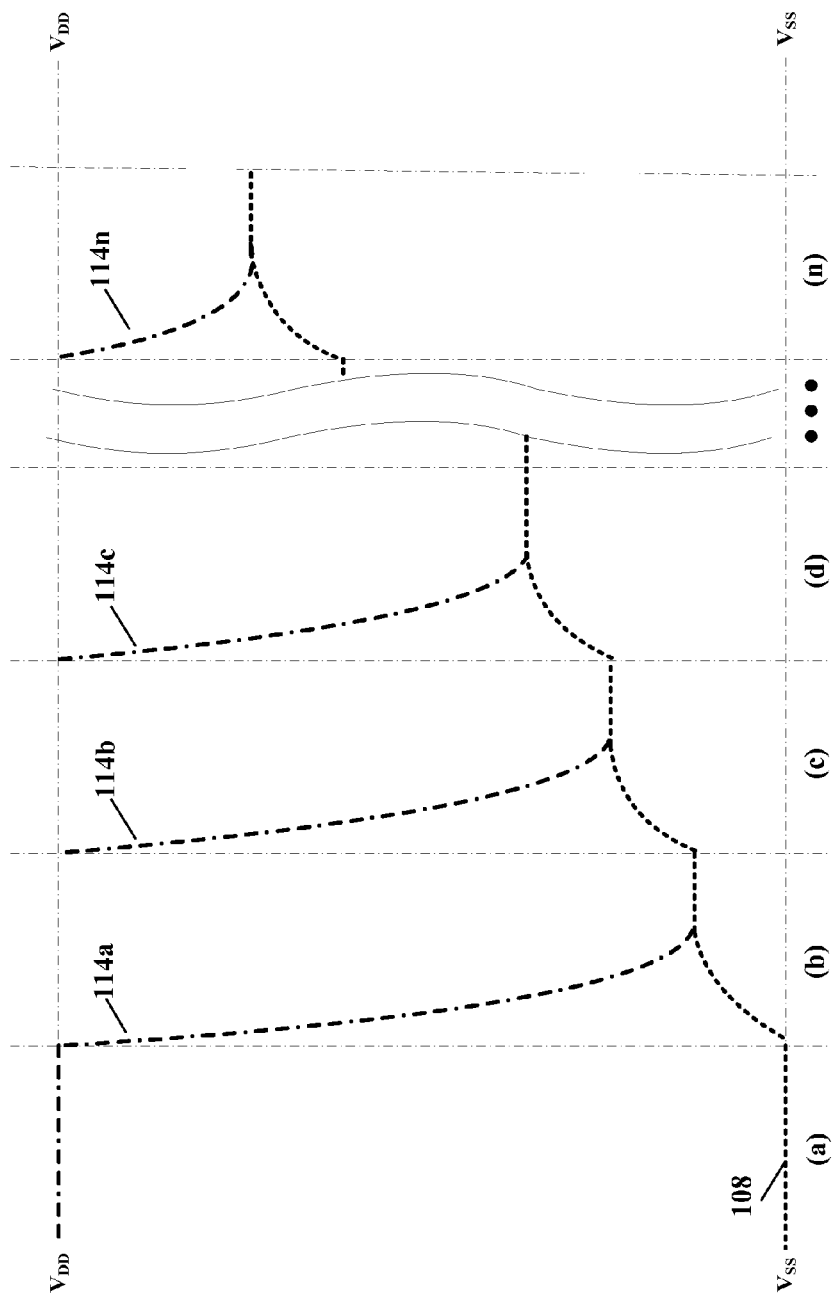
FIG. 2 illustrates schematic voltage-time graphs resulting from the sequential switching configurations shown in FIGS. 1(a)-1(e), according to a specific example embodiment of this disclosure.

Referring to FIGS. 1(a) and 2, all of the capacitive sensor channel switches 112 may connect their respective capacitive sensors 114 to the first voltage, e.g., $V_{DD}$. The sample and hold capacitor 108 may be connected to the second voltage, e.g., $V_{SS}$, through the sample and hold switch 110 and the multiplexer 102. Portion (a) of FIG. 2 shows the capacitive sensors 114 charged to the first voltage and the sample and hold capacitor 108 discharged to the second voltage. FIG. 1(b) shows one of the capacitive sensors 114a connected to the sample and hold capacitor 108 through switch 112a, the multiplexer 102 and the sample and hold switch 110. Portion (b) of FIG. 2 shows a graphical representation of electron charge equalization (voltage equilibrium) between the capacitive sensor 114a and the sample and hold capacitor 108. Since the capacitive sensor 114a has a capacitance value less than the sample and hold capacitor 108, its charge does not much affect the initial charge (none) on the sample and hold capacitor 108.

Figure 1C:
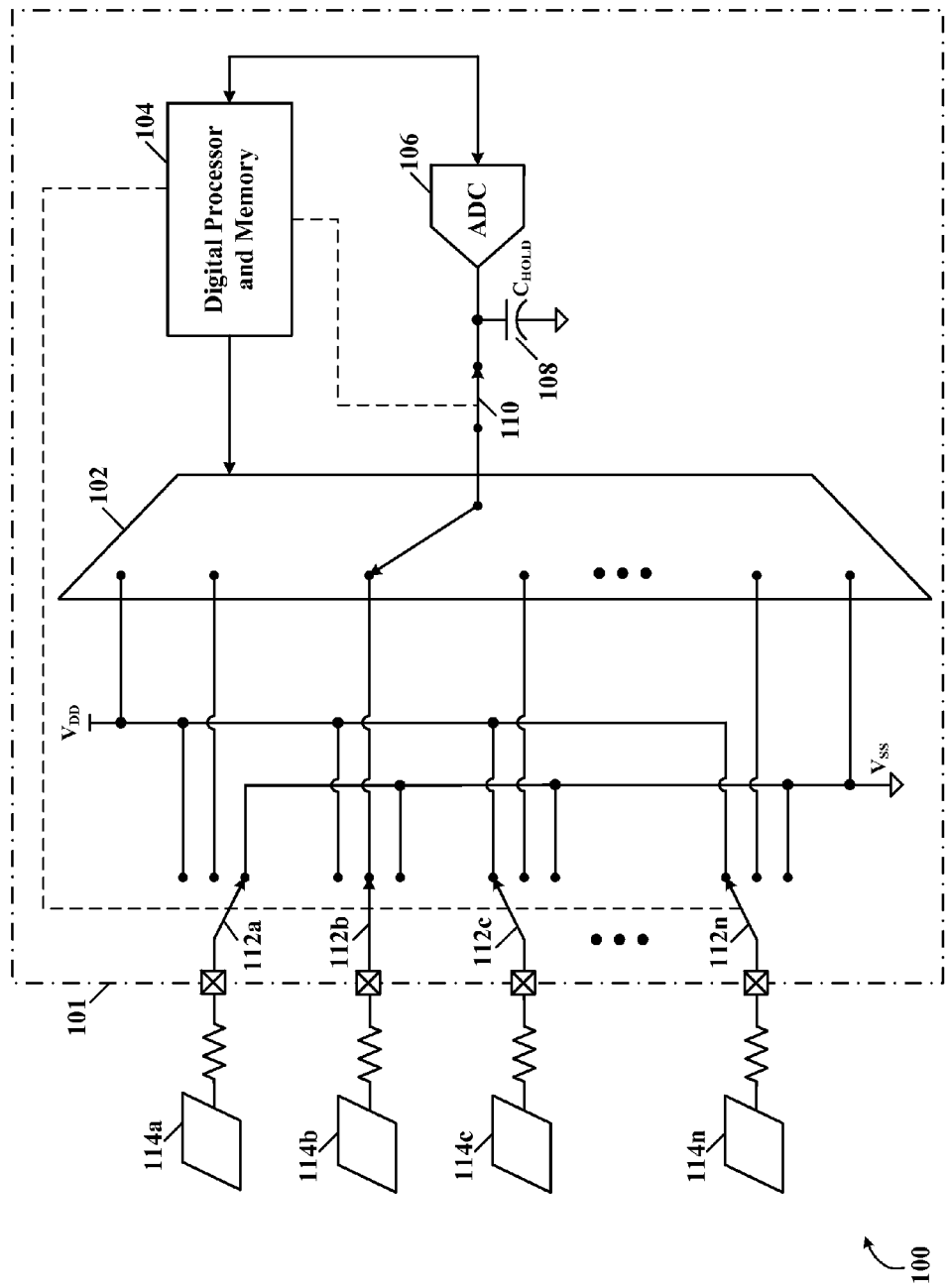

Referring to FIGS. 1(c) and 2, switch 112b may connect the fully charged capacitive sensor 114b to the partially charged sample and hold capacitor 108 through switches 112b and 110, and the multiplexer 102. Portion (c) of FIG. 2 shows a shows a graphical representation of the fully charged capacitive sensor 114b discharging into the partially charged sample and hold capacitor 108. Now the sample and hold capacitor 108 is slightly more charged and comprises a more positive voltage thereon. Switch 112a may also connect the capacitive sensor 114a to the second voltage, e.g., substantially discharging the sensor 114a in anticipation of the next capacitive sensor scan, but using reversed charge/discharge voltages on the capacitive sensors 114 and the sample and hold capacitor 108.

Figure 1D:
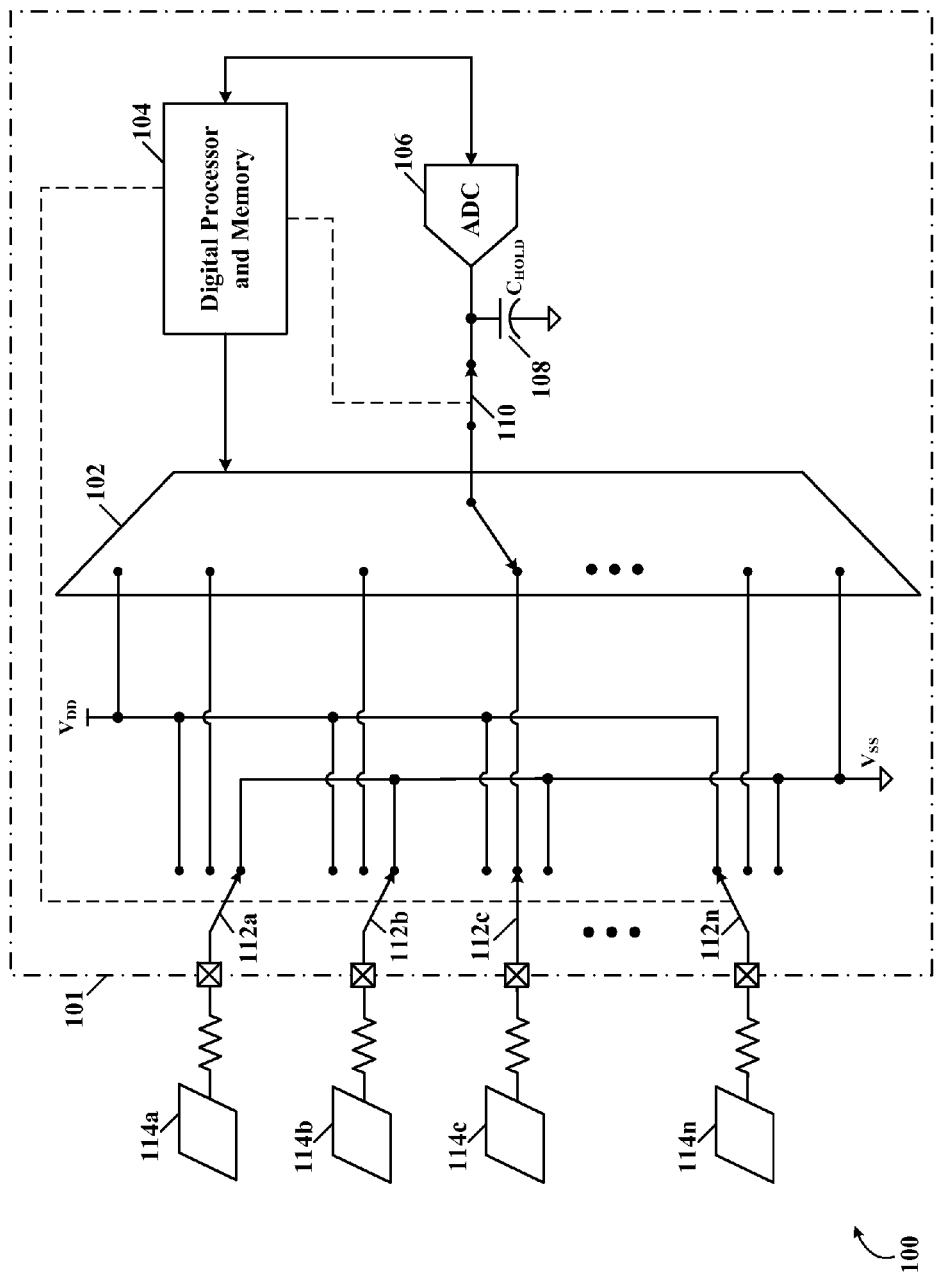

Referring to FIGS. 1(d) and 2, switch 112c may connect the fully charged capacitive sensor 114c to the partially charged sample and hold capacitor 108 through switches 112c and 110, and the multiplexer 102. Portion (d) of FIG. 2 shows a graphical representation of the fully charged capacitive sensor 114c discharging into the partially charged sample and hold capacitor 108. Now the sample and hold capacitor 108 is slightly more charged and comprises an even more positive voltage thereon. Switches 112a and 112b may also connect the capacitive sensors 114a and 114b to the second voltage, e.g., substantially discharging the sensors 114a and 114b in anticipation of the next capacitive sensor scan, but using reversed charge/discharge voltages on the capacitive sensors 114 and the sample and hold capacitor 108.

Figure 1E:
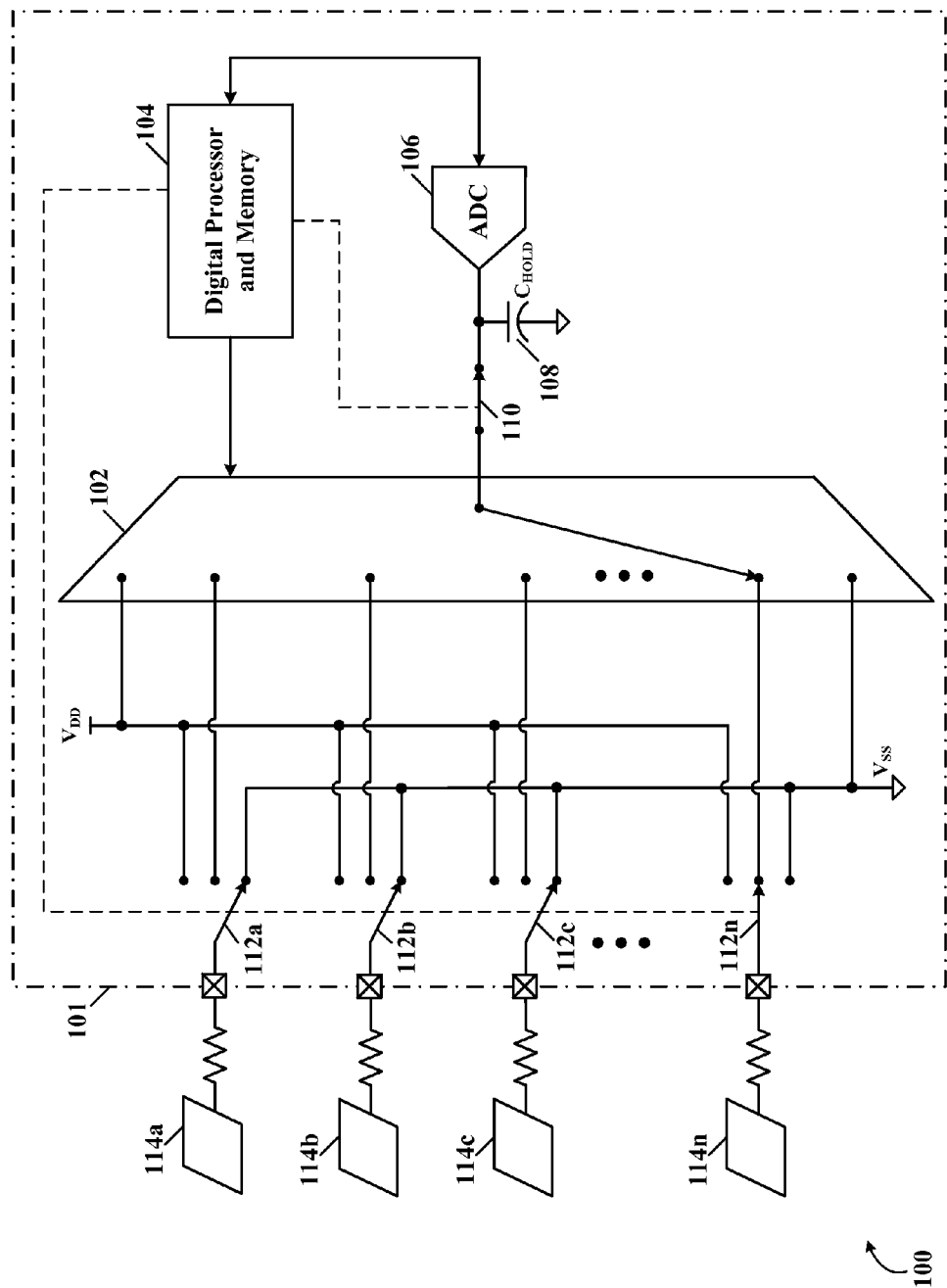

Referring to FIGS. 1(e) and 2, switch 112n may connect the fully charged capacitive sensor 114n to the more partially charged sample and hold capacitor 108 through switches 112n and 110, and the multiplexer 102. Portion (n) of FIG. 2 shows a graphical representation of the fully charged capacitive sensor 114n discharging into the even more partially charged sample and hold capacitor 108. Now the sample and hold capacitor 108 may be substantially charged and comprises a greater positive voltage thereon. Switches 112a, 112b and 122c may also connect the capacitive sensors 114a, 114b and 114c to the second voltage, e.g., substantially discharging the sensors 114a, 114b and 114c in anticipation of the next capacitive sensor scan, but using reversed charge/discharge voltages on the capacitive sensors 114 and the sample and hold capacitor 108.

It is also anticipated and within the scope of this disclosure that the sample and hold switch 110 may briefly open while the multiplexer 102 and the switches 112 are changing configurations so that the switching thereof does not affect the existing charge on the sample and hold capacitor 108.

Figure 1F:
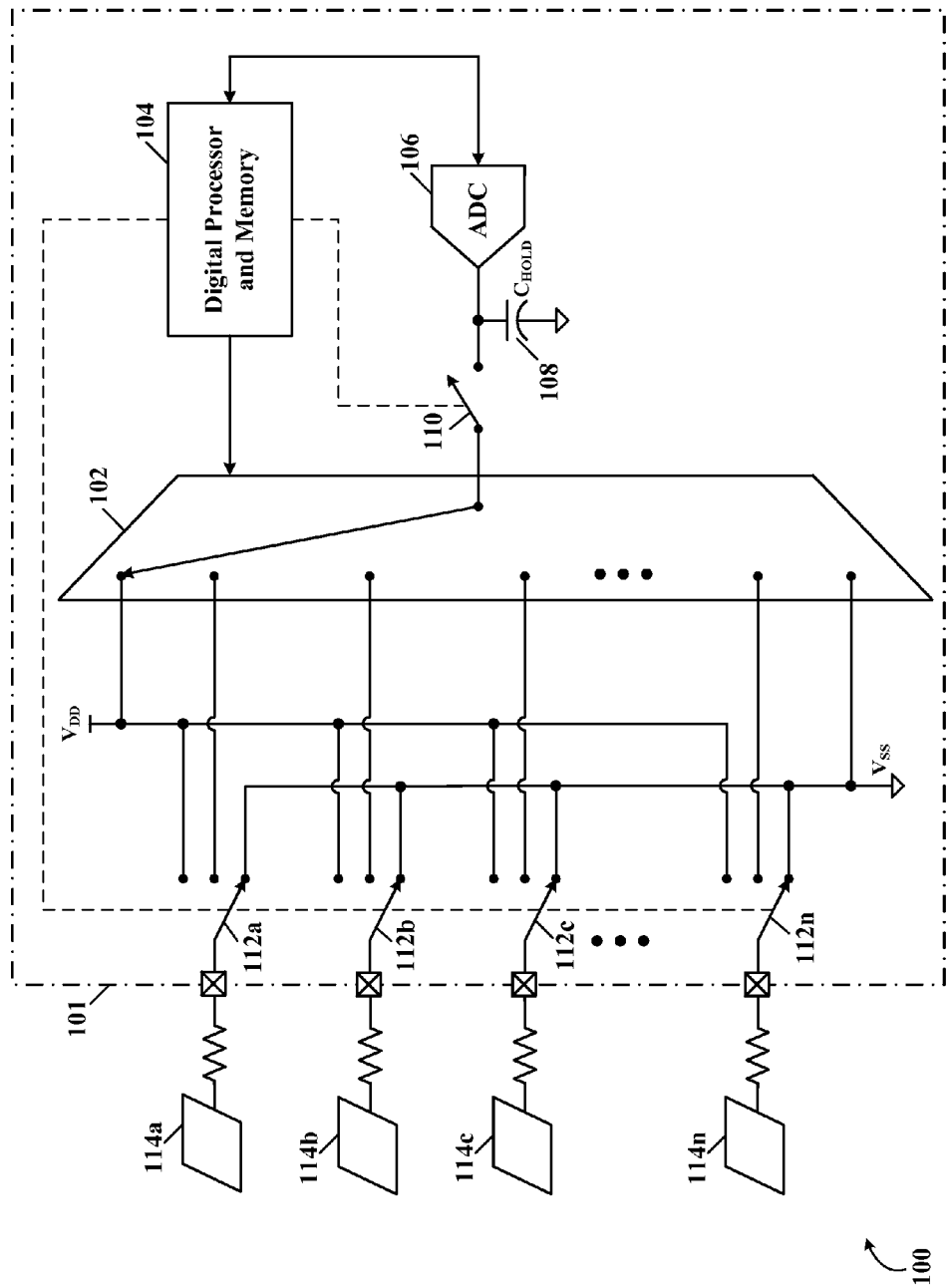

Referring to FIG. 1(f), the sample and hold switch 110 may open, effectively isolating the sample and hold capacitor 108 for further processing. Now the voltage on the sample and hold capacitor 108, representing the sum of the charges from the plurality of capacitive sensors 114, may be converted to a digital value with the ADC 106. This digital value, representing the sum of the charges from the capacitive sensors 114, may then be read by the digital processor 104 for further evaluation thereof. In addition, the multiplexer may be switched to the first voltage, e.g., $V_{DD}$, and all of the capacitive sensor channel switches 112 may be switched to the second voltage, e.g., $V_{SS}$, in anticipation of the next capacitive sensor scan cycle using the reverse polarities of the previous scan.

Figure 1G:
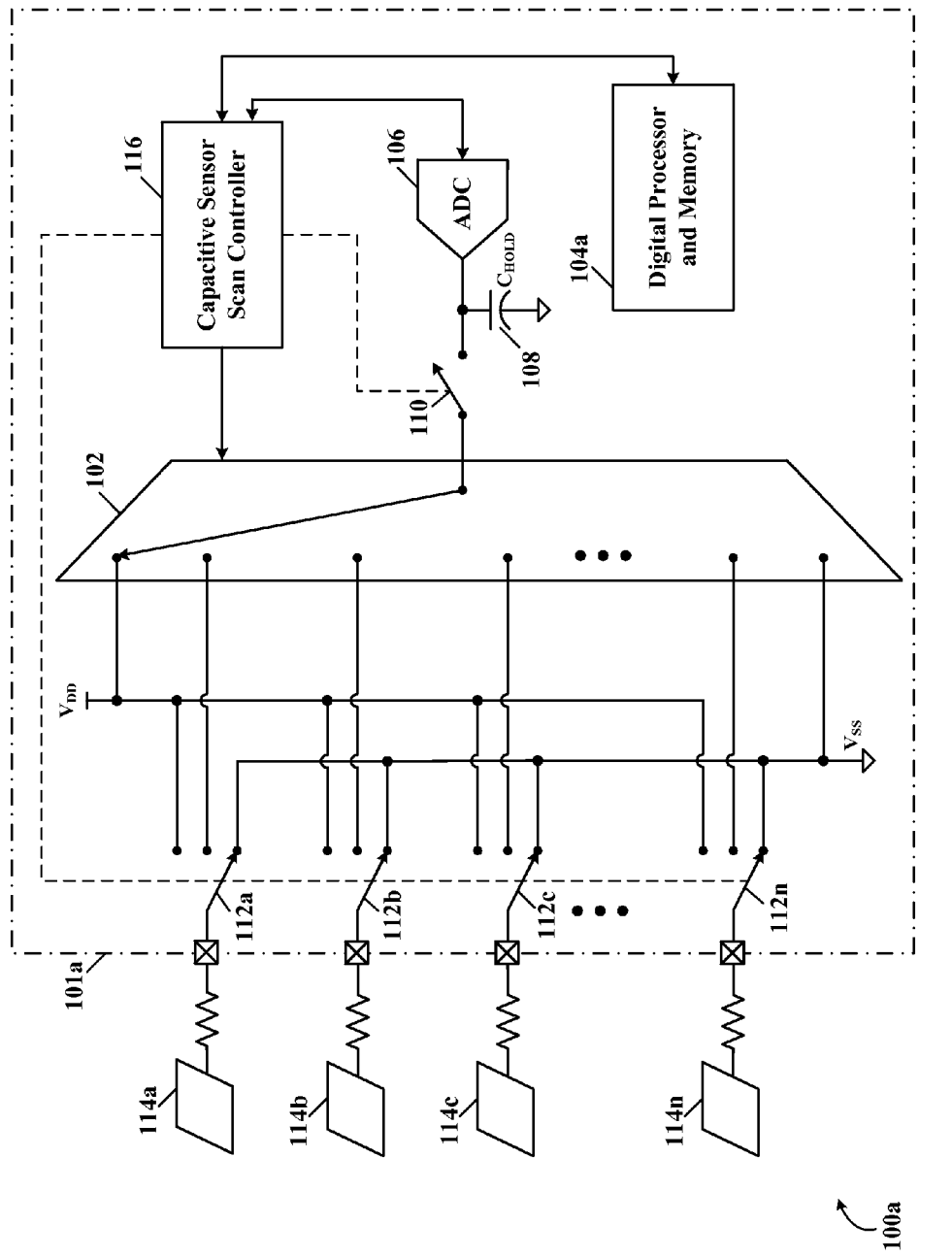
FIG. 1(g) illustrates a schematic diagram of sequential switching configurations for measuring a plurality of capacitive sensors, according to another specific example embodiment of this disclosure.

Referring to FIG. 1(g), depicted is a schematic diagram of sequential switching configurations for measuring a plurality of capacitive sensors, according to another specific example embodiment of this disclosure. A capacitive sensor scan controller peripheral 116 may be used to control the aforementioned switching operations while the digital processor and memory 104a are in a low power sleep mode. This enables scanning of the capacitive sensors 114 using a minimum of power, and the more power hungry digital processor and memory 104a only waking up after a scan has completed.

Figure 1H:
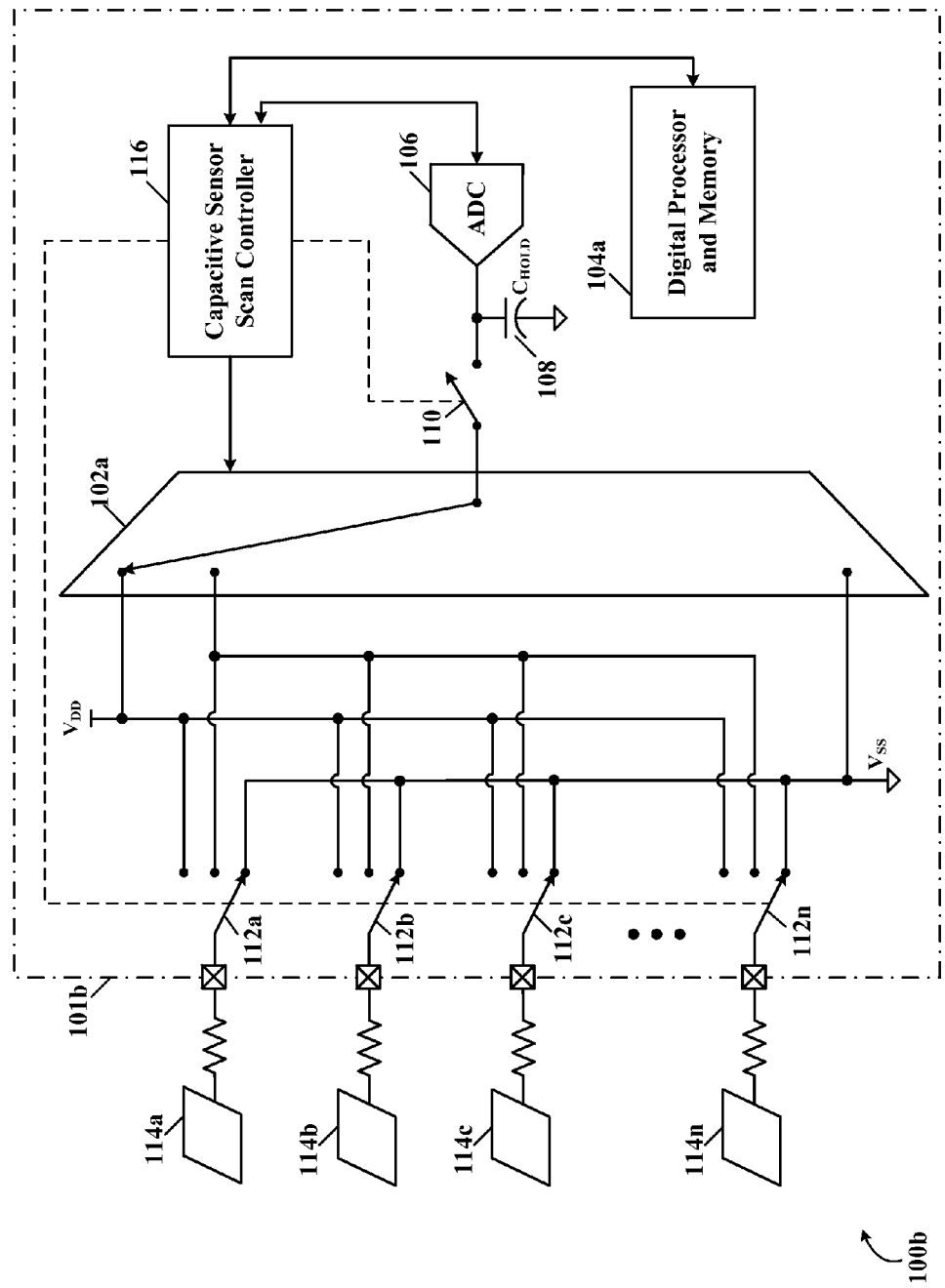
FIG. 1(h) illustrates a schematic diagram of switching configurations for measuring a plurality of capacitive sensors, according to yet another specific example embodiment of this disclosure.

Referring to FIG. 1(h), depicted is a schematic diagram of switching configurations for measuring a plurality of capacitive sensors, according to yet another specific example embodiment of this disclosure. The circuit shown in FIG. 1(h) may "collect" the charges on a plurality of capacitive sensors 114 in a sample and hold capacitor 108 before doing an analog-to-digital conversion of these collect charges. A capacitive sensor touch/proximity system, generally represented by the numeral 100b, may comprise a plurality of capacitive sensors 114, capacitive sensor channel switches 112, a multiplexer 102a, a sample and hold switch 110, a sample and hold capacitor 108, an analog-to-digital converter (ADC) 106, a digital processor and memory 104, and optionally a capacitive sensor scan controller peripheral 116. The aforementioned capacitive sensor channel switches 112, multiplexer 102a, sample and hold switch 110, sample and hold capacitor 108, ADC 106, digital processor and memory 104a, and capacitive sensor scan controller peripheral 116 may be provided in a microcontroller integrated circuit 101b.

The capacitive sensor channel switches 112 may connect respective ones of the plurality of capacitive sensors 114 to either a first voltage, e.g., $V_{DD}$, a second voltage, e.g., $V_{SS}$, or an input of the multiplexer 102. Connecting a capacitive sensor 114 to a positive voltage puts a positive charge thereon, and connecting the capacitive sensor 114 to a common or ground removes substantially any charge thereon. The multiplexer 102 is adapted to couple the sample and hold switch 110 to a common node of the capacitive sensor channel switches 112, the first voltage, e.g., $V_{DD}$, or the second voltage, e.g., $V_{SS}$. The sample and hold switch 110 couplers the output of the multiplexer 102 to the sample and hold capacitor 108 and also may be used to isolate the sample and hold capacitor 108 during an analog-to-digital conversion by the ADC 106. The resulting analog-to-digital conversion from the ADC 106 may be read by the digital processor 104 for further processing in determining whether at least one of the plurality of capacitive sensors 114 has changed its capacitance value.

The capacitive sensor scan controller peripheral 116 may be used to control the aforementioned switching operations while the digital processor and memory 104a are in a low power sleep mode. This enables scanning of the capacitive sensors 114 using a minimum of power, and the more power hungry digital processor and memory 104a only waking up after a scan has completed.

It is contemplated and within the scope of this disclosure that other and different switching arrangements may be designed to couple the capacitive sensors 114 to the first and second voltages, and to the sample and hold capacitor by one having ordinary skill in the art of digital electronics and having the benefit of this disclosure.

Figure 3:
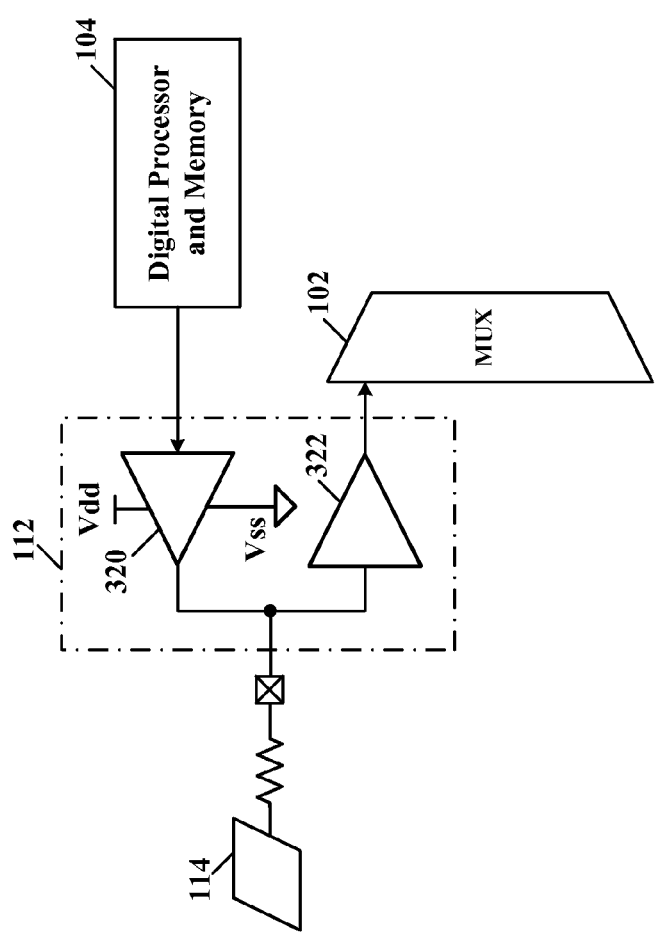
FIG. 3 illustrates a schematic diagram of a typical voltage charging/discharging driver and a voltage input receiver, according to a specific example embodiment of this disclosure.
Figure 4:
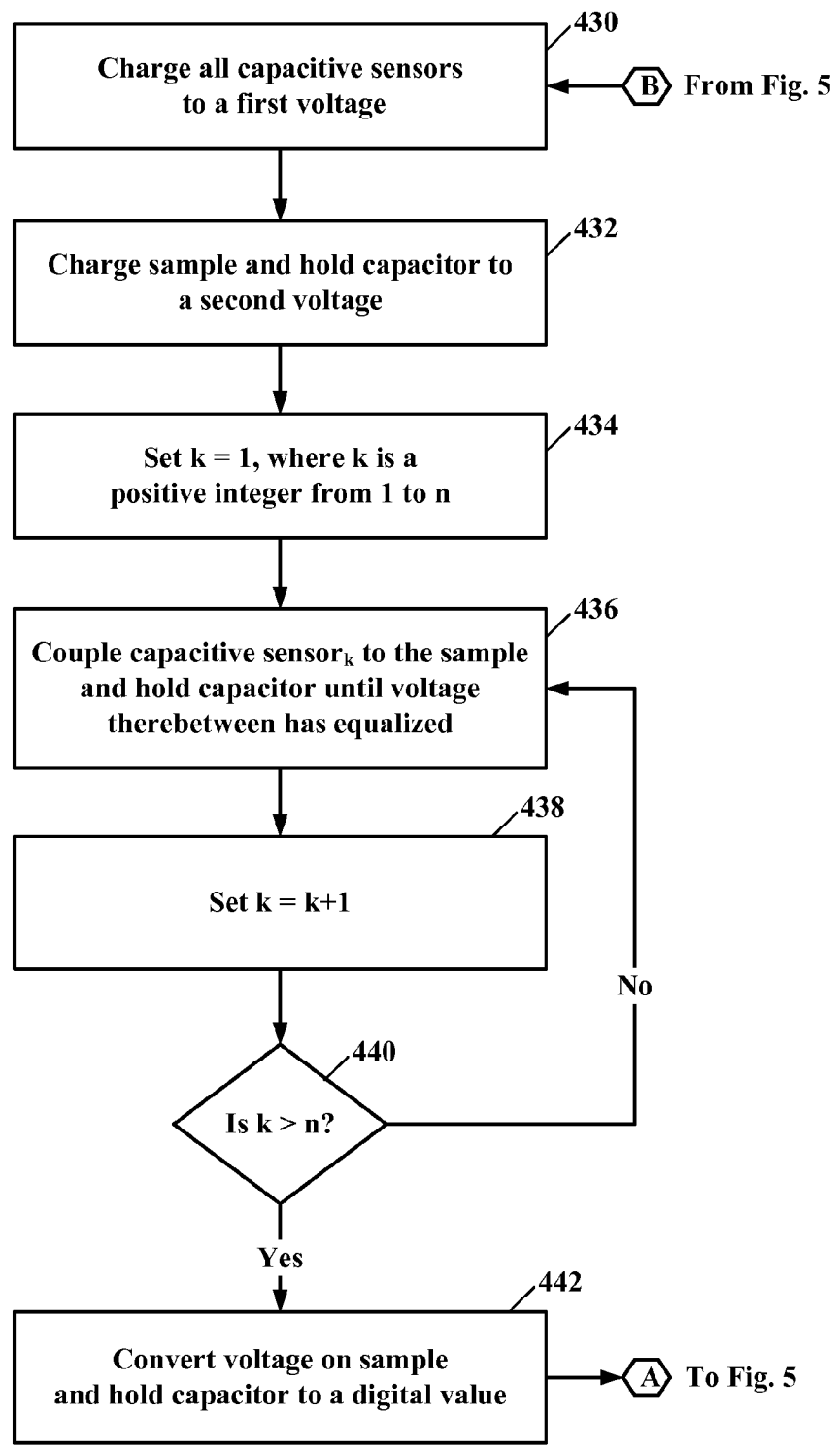
FIGS. 4-7 illustrate schematic process diagrams for operation of the multiple channel capacitive voltage divider scanning method, according to a specific example embodiment of this disclosure.
Figure 5:
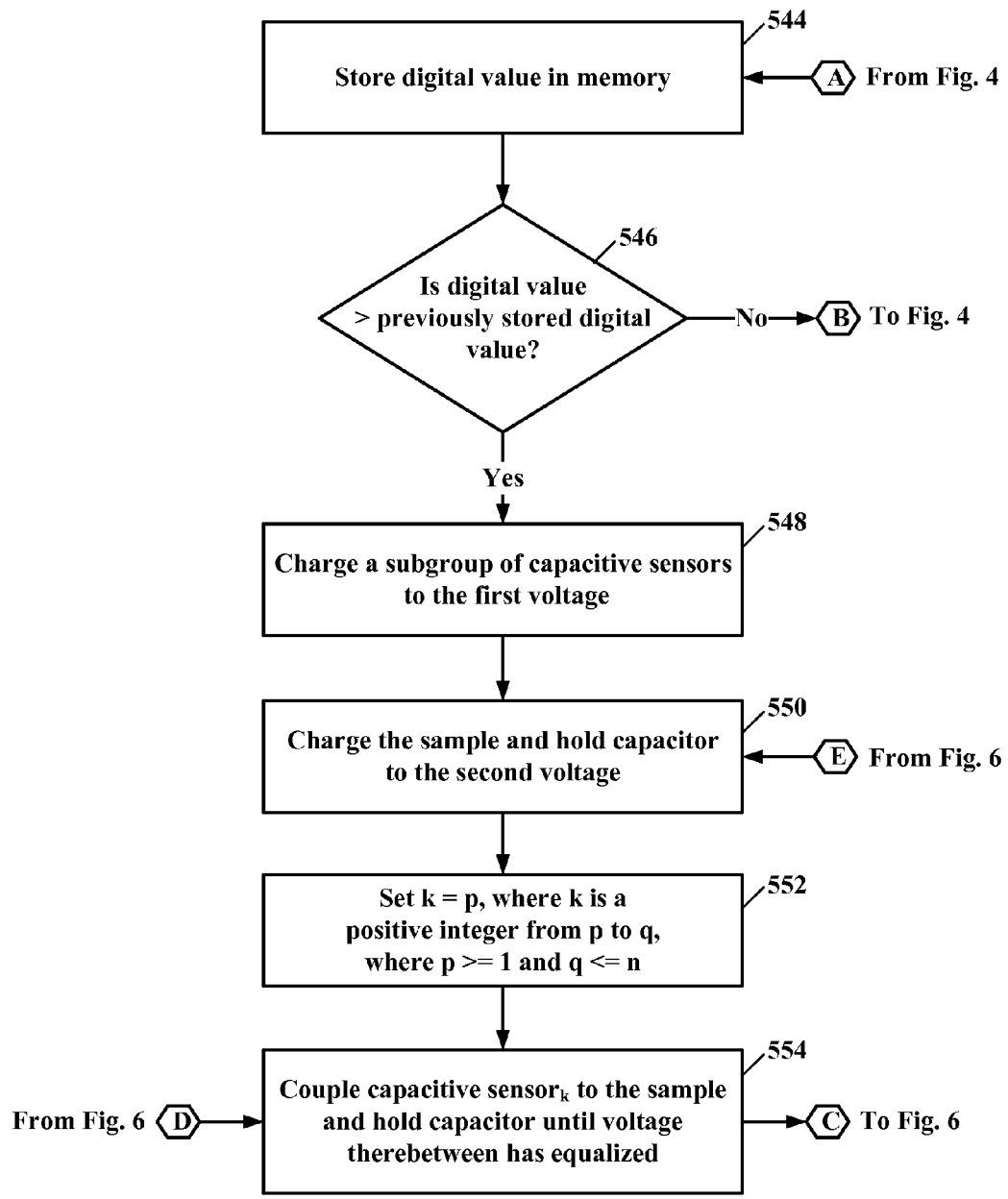
Figure 6:
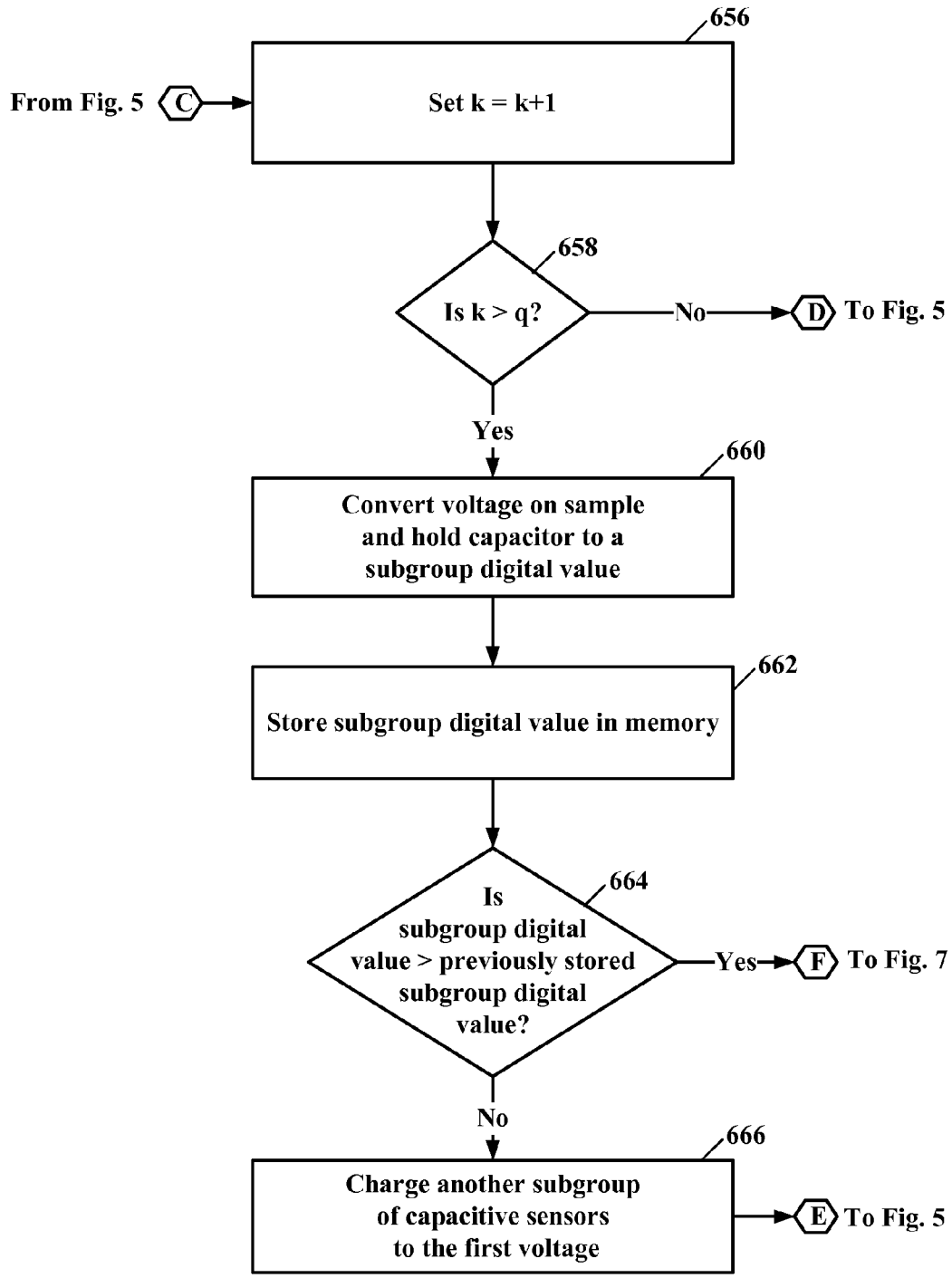
Figure 7:
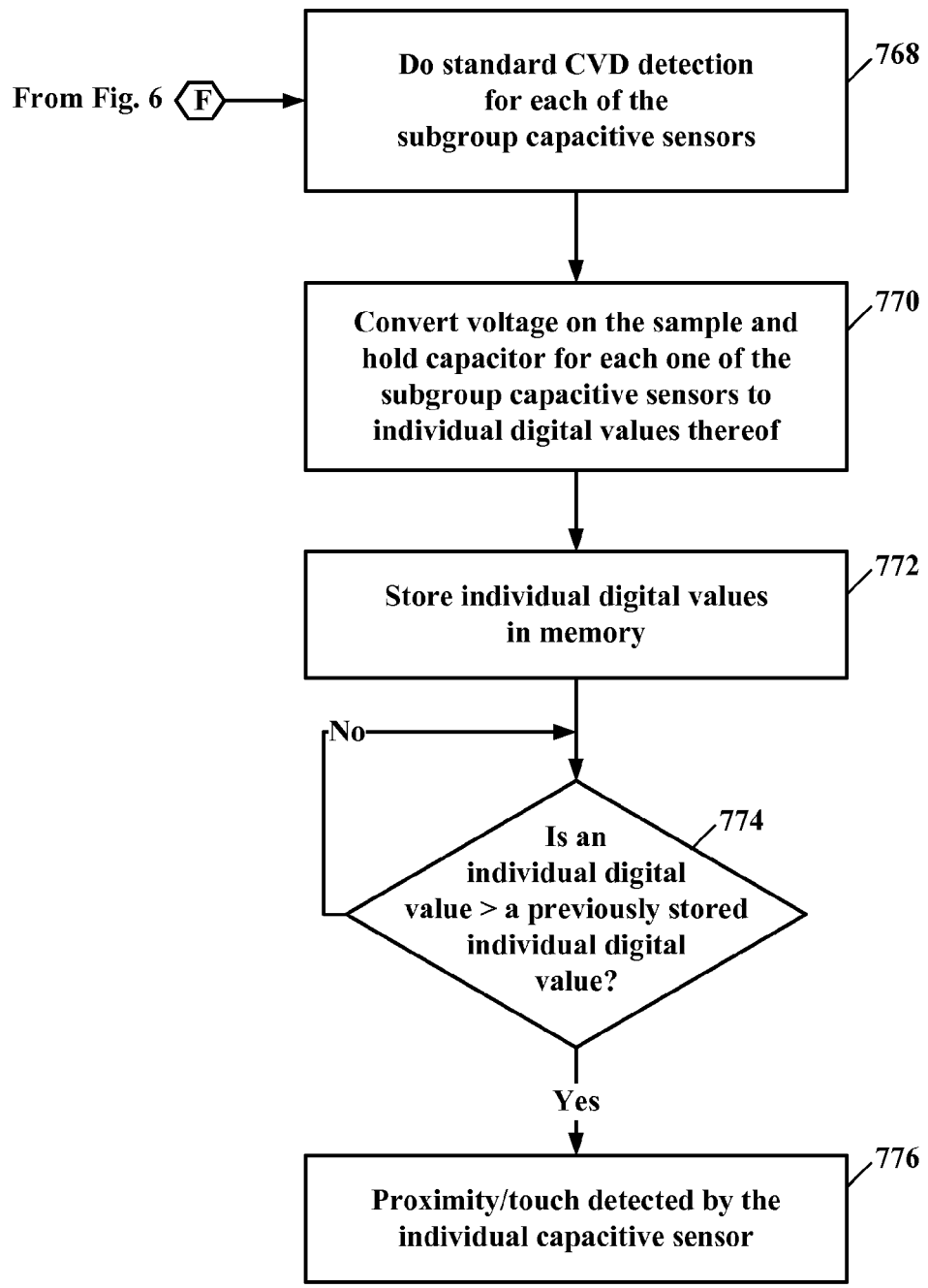
Figure 8:
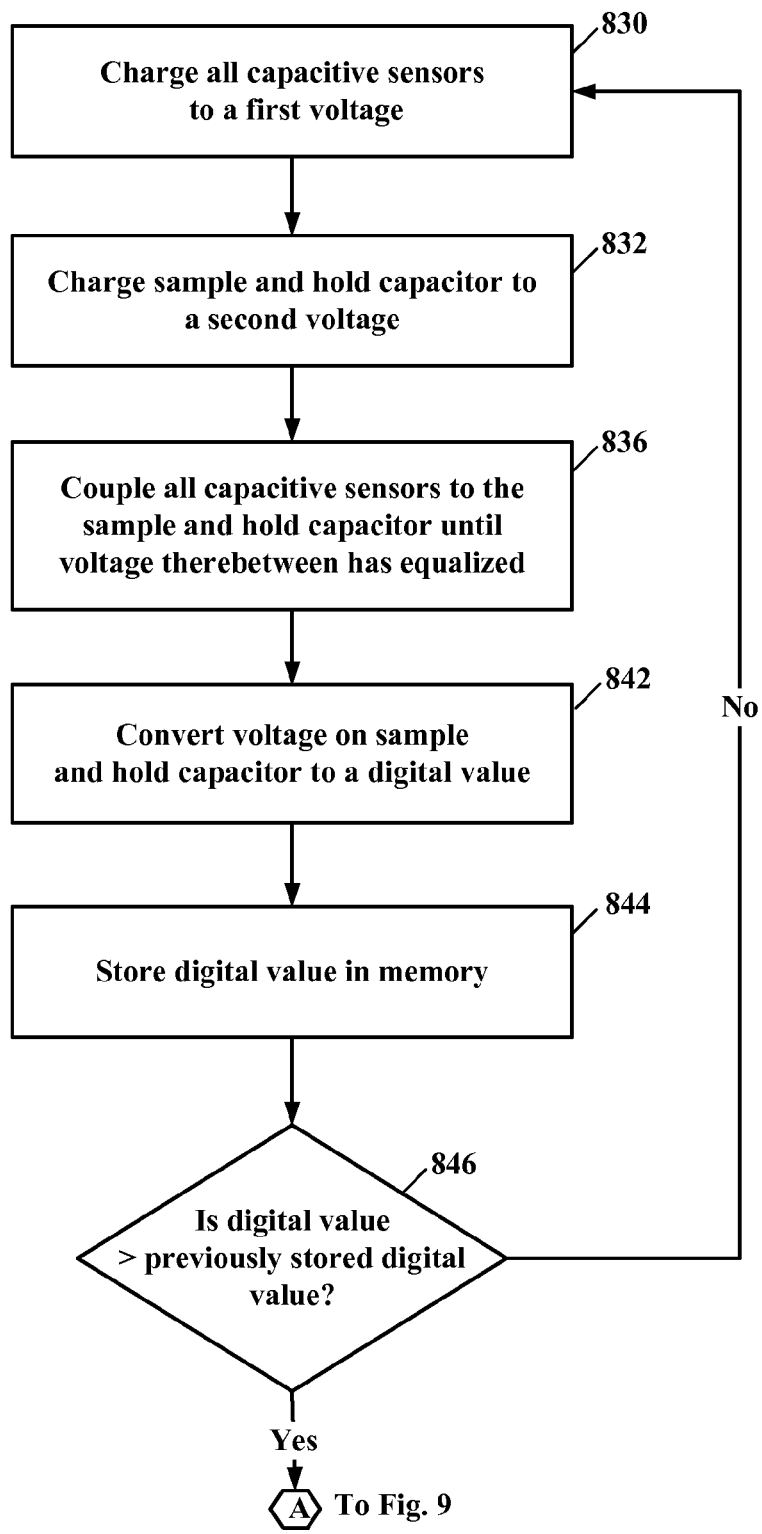
FIGS. 8-11 illustrate schematic process diagrams for operation of the multiple channel capacitive voltage divider scanning method, according to another specific example embodiment of this disclosure.
Figure 9:
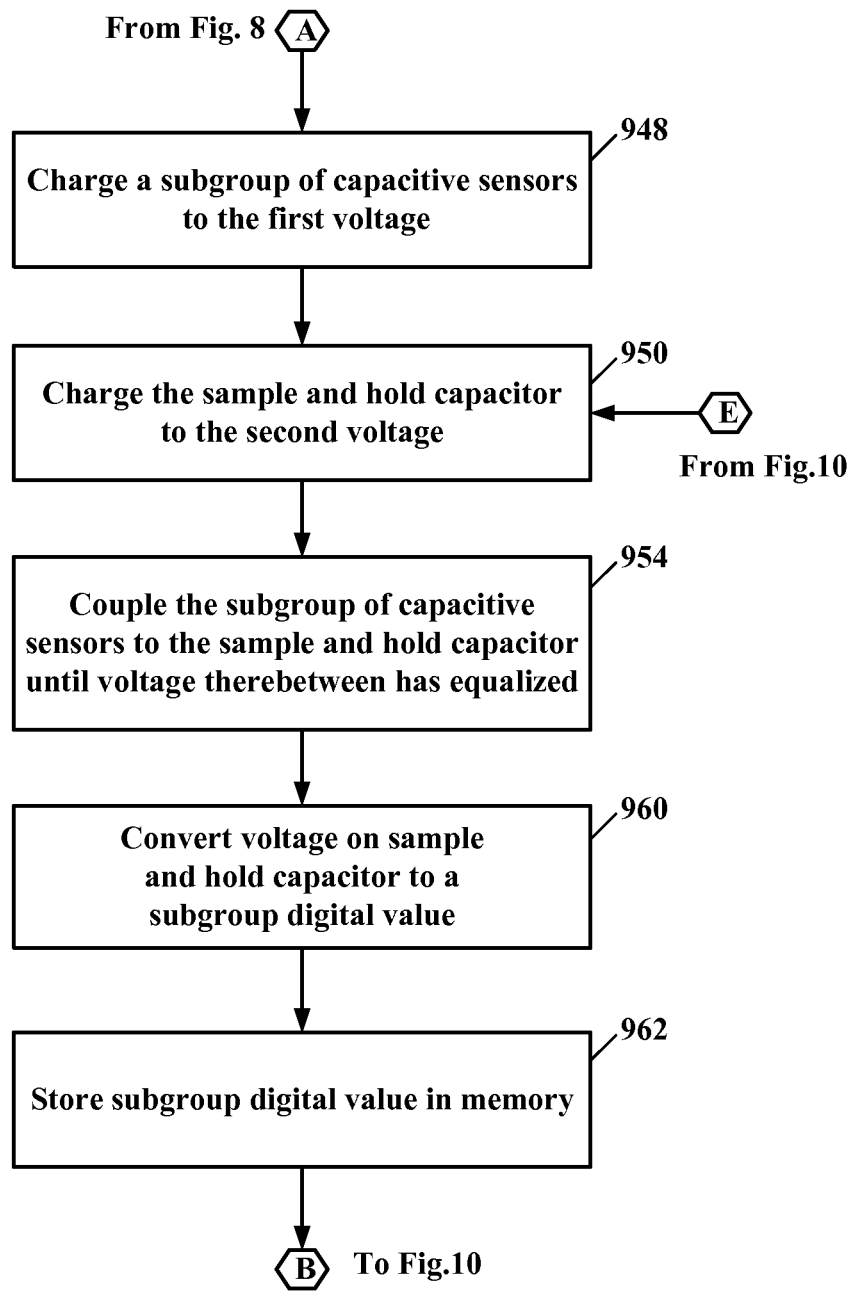
Figure 10:
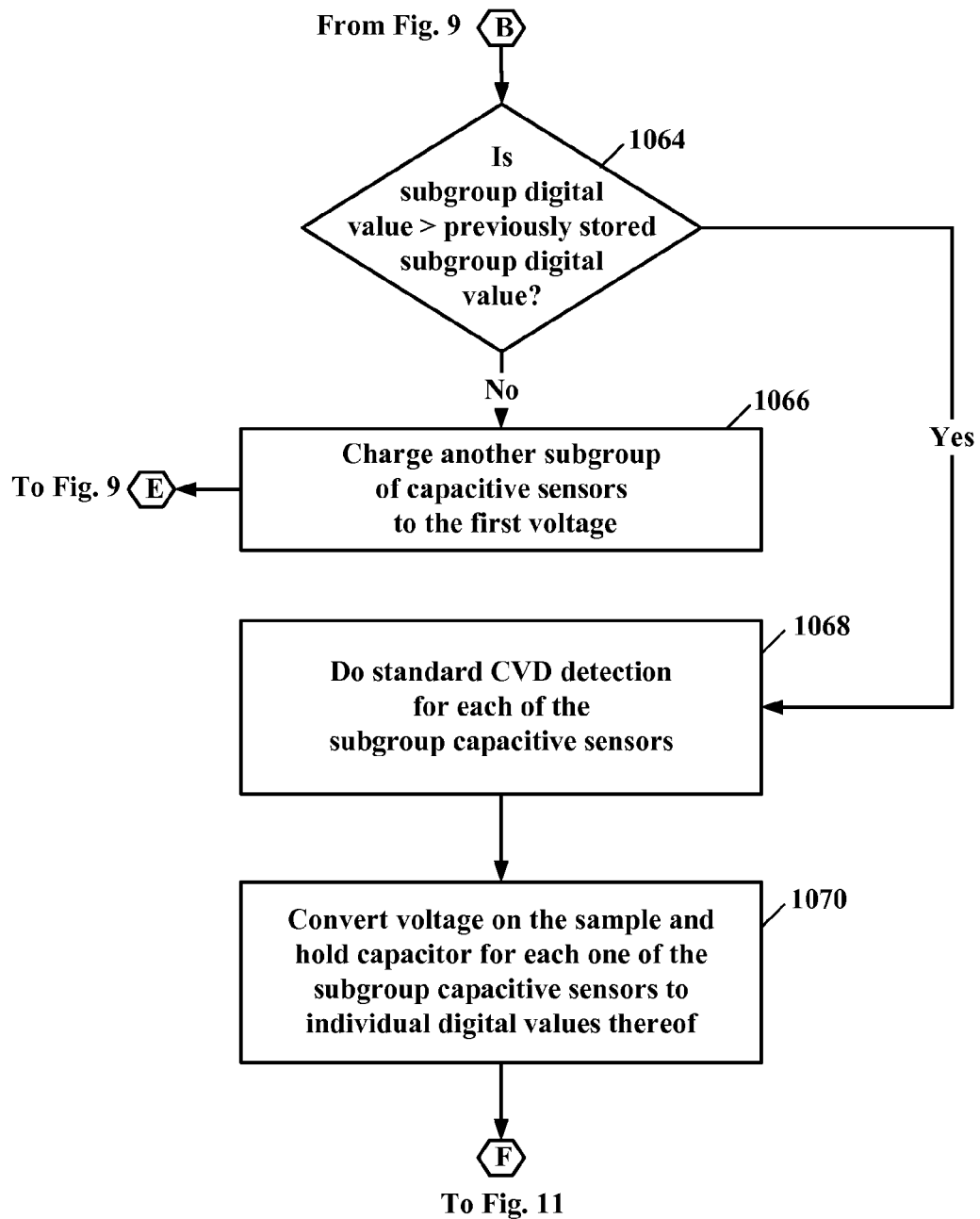
Figure 11:
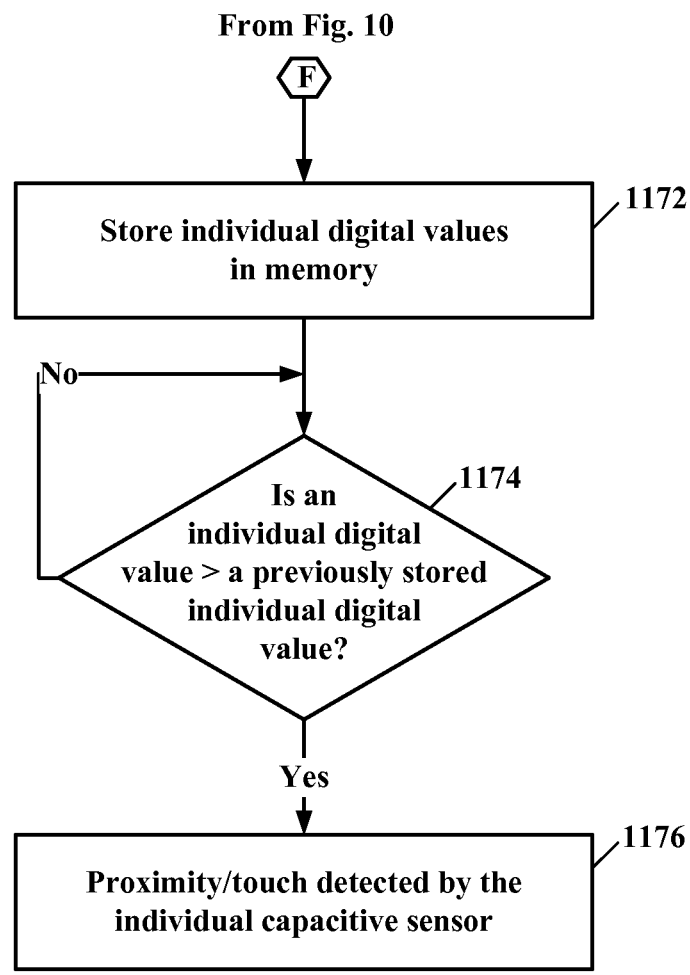

Referring to FIG. 3, depicted is a schematic diagram of a typical voltage charging/discharging driver and a voltage input receiver, according to a specific example embodiment of this disclosure. Each of the capacitive sensor channel switches 112 may comprise a tri-state driver 320 having a high output state at substantially $V_{DD}$, a low output state at substantially, $V_{SS}$, and an open or high impedance state; and an analog receiver/buffer 322 for coupling the voltage on the respective capacitive sensor 114 to an input of the multiplexer 102. The tri-state driver 320 may be controller by the digital processor 104.

Referring to FIGS. 4-7, depicted are schematic process diagrams for operation of the multiple channel capacitive voltage divider scanning method, according to a specific example embodiment of this disclosure. In step 430 all capacitive sensors 114 may be charged (discharged) to a first voltage, e.g., $V_{DD}$ or $V_{SS}$. In step 432 the sample and hold capacitor 108 may be discharged (charged) to a second voltage, e.g., $V_{SS}$ or $V_{DD}$. Step 434 initiates the beginning of a capacitive sensor scan by setting an indexing value, k, to one (1), according to specific example embodiments of this disclosure. In step 436 the $k^{th}$ capacitive sensor 114 may be coupled to the sample and hold capacitor 108. Step 438 increments the k value by 1. Then step 440 checks the k value to see if all capacitive sensors 114 have been coupled to the sample and hold capacitor 108. If not, then the next $k^{th}$ capacitive sensor 114 may be coupled to the sample and hold capacitor 108. Once all of the capacitive sensors 114 have been individually coupled to the sample and hold capacitor 108, the voltage on the sample and hold capacitor 108 is converted to a digital value in step 442. It is contemplated and within the scope of this disclosure that the capacitive sensors 114 may be randomly and/or selectively coupled in any order to the sample and hold capacitor 108 depending upon the application and situation that may have been previously determined from a recognizable pattern of proximity and/or touch detections.

In step 544 this digital value may be stored in the digital processor memory 104. Then in step 546 the digital processor 104 or capacitive sensor scan controller 116 may compare this stored digital value with a previously stored digital value of the same configuration capacitive sensor 114 scan. If there is substantially no difference in this comparison then the capacitive sensor 114 scan may start again from step 430. If there is a difference in this comparison, e.g., the most recent scan has a digital value greater than the previously scanned digital value, then a proximity/touch condition has changed since the previous scan. For this situation either a more refined grouping(s) of capacitive sensors 114 may be scanned, or a standard CVD evaluation of each individual capacitive sensor 114 may be performed, depending on the application thereof.

In the case where subgroups of capacitive sensors 114 may be scanned, step 548 may charge a subgroup of the capacitive sensors 114 to a first voltage. In step 550 the sample and hold capacitor 108 may be charged to a second voltage. A subgroup range of capacitive sensors 114 to be scanned may be selected in step 552. In step 554 a capacitive sensor 114 may be coupled to the sample and hold capacitor 108 until voltage is equalized therebetween. In step 656 the sensor pointer k is advanced, and in step 658 the k value is checked to see if all of the selected subgroup of sensors 114 have be scanned. If not, then return to step 554 for the next capacitive sensor 114 to be coupled to the sample and hold capacitor 108. If all of the subgroup of sensors 114 have been scanned, then in step 660 convert the voltage on the sample and hold capacitor 108, representing the charges from all of the subgroup of capacitive sensors 114, to a subgroup digital value. In step 662 this subgroup digital value may be stored in the digital processor memory 104.

Then in step 664 the digital processor 104 may compare this stored digital subgroup value with a previously stored digital subgroup value of the same configuration capacitive sensor 114 scan. If there is substantially no difference in this comparison then the capacitive sensor 114 scan may start again from step 666 by charging another subgroup of capacitive sensors 114 to the first voltage. If the is a difference in this comparison, e.g., the most recent scan has a digital value greater than the previously scanned digital value, then a proximity/touch condition in this subgroup has changed since the previous scan. For this situation either a more refined grouping(s) of capacitive sensors 114 may be scanned, or a standard CVD evaluation of each individual capacitive sensor 114 may be performed, depending on the application thereof.

In step 768 standard CVD detections for each of the subgroup capacitive sensors 114 may be performed. As follows, in step 770 convert the voltages on the sample and hold capacitor 108 for each one of the subgroup capacitive sensors to individual digital values thereof. In step 772 store each of these individual digital values in the digital processor memory 104. In step 774 check each one of the stored individual digital values to see is there is a change in any one of them from previously stored digital values. If there is at least one difference then in step 776 that is the at least one capacitive sensor 114 that had a proximity/touch event occur to it.

Referring to FIGS. 8-11, depicted are schematic process diagrams for operation of the multiple channel capacitive voltage divider scanning method, according to another specific example embodiment of this disclosure. In step 830 all capacitive sensors 114 may be charged (discharged) to a first voltage, e.g., $V_{DD}$ or $V_{SS}$. In step 832 the sample and hold capacitor 108 may be discharged (charged) to a second voltage, e.g., $V_{SS}$ or $V_{DD}$. In step 836 all of the capacitive sensors 114 may be coupled to the sample and hold capacitor 108. Once the capacitive sensors 114 have been coupled to the sample and hold capacitor 108, the voltage on the sample and hold capacitor 108 is converted to a digital value in step 842.

In step 544 this digital value may be stored in the digital processor memory 104. Then in step 846 the digital processor 104a or capacitive sensor scan controller 116 may compare this stored digital value with a previously stored digital value of the same configuration capacitive sensor 114 scan. If there is substantially no difference in this comparison then the capacitive sensor 114 scan may start again from step 830. If there is a difference in this comparison, e.g., the most recent scan has a digital value greater than the previously scanned digital value, then a proximity/touch condition has changed since the previous scan. For this situation either a more refined grouping(s) of capacitive sensors 114 may be scanned, or a standard CVD evaluation of each individual capacitive sensor 114 may be performed, depending on the application thereof.

In the case where subgroups of capacitive sensors 114 may be scanned, step 948 may charge a subgroup of the capacitive sensors 114 to a first voltage. In step 950 the sample and hold capacitor 108 may be charged to a second voltage. In step 954 the subgroup of capacitive sensors 114 may be coupled to the sample and hold capacitor 108 until voltage is equalized therebetween. In step 960 the voltage on the sample and hold capacitor 108 is converted to a subgroup digital value representing the charges from all of the subgroup of capacitive sensors 114. In step 962 this subgroup digital value may be stored in the digital processor memory 104.

Then in step 1064 the digital processor 104 may compare this stored digital subgroup value with a previously stored digital subgroup value of the same configuration capacitive sensor 114 scan. If there is substantially no difference in this comparison then the capacitive sensor 114 scan may start again from step 1066 by charging another subgroup of capacitive sensors 114 to the first voltage. If the is a difference in this comparison, e.g., the most recent scan has a digital value greater than the previously scanned digital value, then a proximity/touch condition in this subgroup has changed since the previous scan. For this situation either a more refined grouping(s) of capacitive sensors 114 may be scanned, or a standard CVD evaluation of each individual capacitive sensor 114 may be performed, depending on the application thereof.

In step 1068 standard CVD detections for each of the subgroup capacitive sensors 114 may be performed. As follows, in step 1070 convert the voltages on the sample and hold capacitor 108 for each one of the subgroup capacitive sensors to individual digital values thereof. In step 1172 store each of these individual digital values in the digital processor memory 104. In step 1174 check each one of the stored individual digital values to see is there is a change in any one of them from previously stored digital values. If there is at least one difference then in step 1176 that is the at least one capacitive sensor 114 that had a proximity/touch event occur to it. It is contemplated and within the scope of this disclosure that the capacitive sensors 114 may be randomly and/or selectively coupled in any order to the sample and hold capacitor 108 depending upon the application and situation that may have been previously determined from a recognizable pattern of proximity and/or touch detections.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for determining change in capacitance of at least one capacitive sensor of a plurality of capacitive sensors, said method comprising steps of:
   coupling by first switches the plurality of capacitive sensors with a first voltage;
   coupling by second switches a sample and hold capacitor with a second voltage;
   coupling by the first and second switches the plurality of capacitive sensors with the sample and hold capacitor, wherein electron charge from the plurality of capacitive sensors is transferred to the sample and hold capacitor;
   measuring by a processor a resulting voltage on the sample and hold capacitor; and
   comparing by the processor the resulting voltage to a previously measured resulting voltage, wherein if the resulting voltage is different than the previously measured resulting voltage then the at least one capacitive sensor of the plurality of capacitive sensors has changed capacitance value.

2. The method according to claim 1, further comprising the steps of:
   coupling by the first switches a portion of the plurality of capacitive sensors with the first voltage;
   coupling by the second switches the sample and hold capacitor with the second voltage;
   coupling by the first and second the portion of the plurality of capacitive sensors with the sample and hold capacitor, wherein electron charge from the portion of the plurality of capacitive sensors is transferred to the sample and hold capacitor;
   measuring by the processor a resulting voltage on the sample and hold capacitor; and
   comparing by the processor the measured resulting voltage to a previously measured resulting voltage of the portion of the plurality of capacitive sensors, wherein if the measured resulting voltage is different than the previously measured resulting voltage then at least one capacitive sensor of the portion of the plurality of capacitive sensors has changed capacitance value.

3. The method according to claim 2, further comprising if the measured resulting voltage is not substantially different than the previously measured resulting voltage then perform the steps of:
   coupling by the first switches another portion of the plurality of capacitive sensors with the first voltage;
   coupling by the second switches the sample and hold capacitor with the second voltage;
   coupling by the first and second switches the another portion of the plurality of capacitive sensors with the sample and hold capacitor, wherein electron charge from the another portion of the plurality of capacitive sensors is transferred to the sample and hold capacitor;
   measuring by the processor another resulting voltage on the sample and hold capacitor; and
   comparing by the processor the another resulting voltage to a previously measured another resulting voltage of the another portion of the plurality of capacitive sensors, wherein if the resulting another voltage is different than the previously measured another resulting voltage then at least one capacitive sensor of the another portion of the plurality of capacitive sensors has changed capacitance value.

4. The method according to claim 2, further comprising the steps of:
   (a) coupling by the first switches a first one of the portion of the plurality of capacitive sensors with the first voltage;
   (b) coupling by the second switches the sample and hold capacitor with the second voltage;
   (c) coupling by the first and second switches the first one of the portion of the plurality of capacitive sensors with the sample and hold capacitor, wherein electron charge from the first one of the portion of the plurality of capacitive sensors is transferred to the sample and hold capacitor;

(d) measuring by the processor a resulting voltage on the sample and hold capacitor; and (e) comparing by the processor the measured resulting voltage to a previously measured resulting voltage of the first one of the portion of the plurality of capacitive sensors, wherein if the measured resulting voltage is different than the previously measured resulting voltage then the first one of the portion of the plurality of capacitive sensors has changed capacitance value, if not repeat steps (a) through (e) with another one of the portion of the plurality of capacitive sensors.

5. The method according to claim 1, wherein the first voltage is more positive than the second voltage.

6. The method according to claim 1, wherein the second voltage is more positive than the first voltage.

7. The method according to claim 1, wherein a step of measuring the resulting voltage comprises the step of converting the resulting voltage on the sample and hold capacitor to a digital value with an analog-to-digital converter (ADC).

8. The method according to claim 7, wherein a step of comparing the measured resulting voltage to a previously measured resulting voltage comprises the steps of comparing the digital value to a previous digital value with a digital processor.

9. The method according to claim 8, further comprising a step of waking up the digital processor from a low power sleep mode when the measured resulting voltage is different from the previously measured resulting voltage.

10. An apparatus, for determining change in capacitance of at least one capacitive sensor of a plurality of capacitive sensors, comprising:
  a plurality of capacitive sensors;
  a sample and hold capacitor;
  a multiplexer having a plurality of inputs and an output;
  a plurality of capacitive sensor switches coupled to the plurality of capacitive sensors, and adapted to couple the plurality of capacitive sensors to the first voltage, the second voltage or an input of the multiplexer;
  a sample and hold switch coupled between the output of the multiplexer and the sample and hold capacitor;
  an analog-to-digital converter (ADC) having an analog input coupled to the sample and hold capacitor; and
  a digital processor coupled to an output of the ADC and adapted to control the plurality of capacitive sensor switches, multiplexer, and sample and hold switch such that:
  the plurality of capacitive sensor switches couple the plurality of capacitive sensors with a first voltage;
  the multiplexer couples the sample and hold capacitor with a second voltage;
  the plurality of capacitive sensor switches and the multiplexer couple the plurality of capacitive sensors with the sample and hold capacitor, wherein electron charge from the plurality of capacitive sensors is transferred to the sample and hold capacitor;
  a resulting voltage on the sample and hold capacitor is converted by the ADC into a digital value which is fed to the digital processor; and
  the processor is further configured to compare the resulting voltage to a previously measured resulting voltage, wherein if the resulting voltage is different than the previously measured resulting voltage then the digital processor determines that the at least one capacitive sensor of the plurality of capacitive sensors has changed capacitance value.

11. The apparatus according to claim 10, wherein the plurality of capacitive sensor switches, the multiplexer, the sample and hold capacitor, the ADC and the digital processor are provided in a microcontroller.

12. The apparatus according to claim 11, further comprising a capacitive sensor scan controller adapted to control the plurality of capacitive sensor switches, multiplexer, and sample and hold switch while the digital processor is in a low power sleep mode.

13. The apparatus according to claim 12, wherein the capacitive sensor scan controller wakes up the digital processor from the low power sleep mode when the at least one capacitive sensor of the plurality of capacitive sensors has changed capacitance value.

* * * * *